United States Patent
Willer (10) Patent No.: US 6,674,132 B2
(45) Date of Patent: Jan. 6, 2004

(54) MEMORY CELL AND PRODUCTION METHOD

(75) Inventor: Josef Willer, Riemerling (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/927,554

(22) Filed: Aug. 9, 2001

(65) Prior Publication Data

US 2002/0020890 A1 Feb. 21, 2002

(30) Foreign Application Priority Data

Aug. 9, 2000 (DE) ........................................ 100 38 877

(51) Int. Cl.$^7$ ............................................. H01L 29/94
(52) U.S. Cl. ........................ 257/390; 257/374; 257/381; 257/413; 257/377; 257/387; 257/408; 438/128; 438/129; 438/130; 438/275; 438/278; 438/280
(58) Field of Search ................................ 257/390, 374, 257/377, 381, 387, 408, 412, 413; 438/128–130, 275, 278, 290, 207, 218, 219, 299, 585, 587, 588, 592

(56) References Cited

U.S. PATENT DOCUMENTS

| | | | |
|---|---|---|---|
| 5,254,217 A | * | 10/1993 | Maniar et al. ............... 438/608 |
| 5,279,982 A | * | 1/1994 | Crotti ........................ 438/586 |
| 5,371,030 A | * | 12/1994 | Bergemont ................. 438/261 |
| 5,397,726 A | | 3/1995 | Bergemont |
| 5,705,419 A | * | 1/1998 | Perry et al. ................. 438/588 |
| 5,918,124 A | | 6/1999 | Sung |
| 6,080,624 A | * | 6/2000 | Kamiya et al. ............. 438/257 |

OTHER PUBLICATIONS

Wolf, "Silicon Processing for the VLSI Era", vol. 2, Lattice Press, 1990, p. 354–355.*
Chim et al., "Characterization of Hot–Carrier Reliability In Submicrometre MOSFETs", Research News, Feb. 1997, http://www.eng.nus.edu.sg/EResnews/Feb97/feb97p6.html.*
Hiroshi Aozasa et al.: "Analysis of Carrier Traps in $Si_3N_4$ in Oxide/Nitride/Oxide for Metal/Oxide/Nitride/Oxide/silicon Nonvolatile Memory", Jpn.J.Appl.Phys. vol. 38 (1999) pp. 1441–1447, Part 1, No. 3A, Mar. 1999.

* cited by examiner

Primary Examiner—Nathan J. Flynn
Assistant Examiner—Scott R Wilson
(74) Attorney, Agent, or Firm—Laurence A. Greenberg; Werner H. Stemer; Ralph E. Locher

(57) ABSTRACT

A memory cell, which is isolated from other memory cells by STI trenches, each includes an ONO layer structure between a gate electrode and a channel region formed in a semiconductor body. The gate electrode is a component of a strip-shaped word line. Source and drain regions are disposed between gate electrodes of adjacent memory cells. Source regions are provided with polysilicon layers, in the form of a strip, as common source lines. Drain regions are connected as bit lines through polysilicon fillings to metallic interconnects applied to the top face of the semiconductor body.

14 Claims, 5 Drawing Sheets

MEMORY CELL AND PRODUCTION METHOD

BACKGROUND OF THE INVENTION

Field of the Invention

The invention lies in the field of integrated circuits. The invention relates to a nonvolatile flash memory cell that can be written to and erased electrically and has the form of a semiconductor oxide nitride oxide semiconductor (SONOS) cell. The invention also relates to an associated production method.

One aim in the development of memory modules is to specify a memory cell configuration that is as small as possible, but which nevertheless allows rapid random access to individual memory locations. If possible, it should be possible to produce such a memory cell configuration using conventional production technologies, in particular, for the electronic components provided in the drive periphery.

Very small nonvolatile memory cells are required for very large scale integration densities in multimedia applications. Until now, floating gate flash cells using a NAND, AND, or virtual ground NOR architecture have mainly been used, with the smallest memory cells known from products having an area of $5F^2$. The virtual ground configuration, however, does not allow rapid random read access, which requires a low impedance of its (metallic) bit line as far as the individual memory cell. Standard T-shaped cells with a metallic connection require a considerably larger cell area due to the adjustment separations that are required; floating gate cells such as these whose area is $12F^2$ are now normal.

The publication "Analysis of Carrier Traps in $Si_3N_4$ in Oxide/Nitride/Oxide for Metal/Oxide/Nitride/Oxide/Silicon Nonvolatile Memory" by H. Aozasa et al., in Jpn. J. Appl. Phys. 38, 1441–1447 (1999) describes and investigates a memory layer structure based on an oxide-nitride-oxide layer sequence.

U.S. Pat. No. 5,397,726 to Bergemont describes a flash EPROM in which the memory layer structure is disposed between the semiconductor body and the gate electrode, the source line is provided as a common source connection for a number of memory cells, and a floating gate electrode is provided as the memory layer.

U.S. Pat. No. 6,080,624 to Kamiya et al. describes a nonvolatile semiconductor memory in which a floating gate electrode, provided as a memory layer, is disposed between a gate dielectric and an ONO layer.

U.S. Pat. No. 5,918,124 to Sung discloses the formation of spacing elements for lightly doped drain (LDD) source/drain regions in a multiple memory EEPROM cell.

SUMMARY OF THE INVENTION

It is accordingly an object of the invention to provide a memory cell and production method that overcomes the hereinafore-mentioned disadvantages of the heretofore-known devices and methods of this general type and that provides a nonvolatile memory cell for a very large scale integration density, with short access times, and an associated production method.

With the foregoing and other objects in view, there is provided, in accordance with the invention, a memory cell disposed on a semiconductor body having a top face, the memory cell including a source region formed at the top face, a drain region, a gate line, a gate electrode disposed between the source region and the drain region at the top face, the gate electrode being part of the gate line, the gate line structured in strips and being a word line, a source line being a common source connection for a plurality of memory cells, the source line electrically contacting the source region between the gate electrode and another gate electrode of another of the plurality of memory cells, a drain line being a metallic interconnect electrically conductively connected to the drain region and disposed as a bit line running transversely with respect to the gate line and electrically isolated from the gate line, supply leads respectively connected to the source line, the drain line, and the gate line, and a memory layer structure having a first boundary layer, a second boundary layer, and a memory layer disposed in between the first boundary layer and the second boundary layer. The memory layer, the first boundary layer, and the second boundary layer are each made from a material having a respective energy band gap. The material of the memory layer has a relatively narrow energy band gap. The material of the first boundary layer and the second boundary layer has a relatively wide energy band gap. The memory layer structure is disposed between the semiconductor body and the gate electrode.

In other words, the memory cell according to the invention has an ONO layer structure or an equivalent memory layer structure between a gate electrode and the channel region formed in the semiconductor body. The gate electrode is a component of a word line in strip form. There are source and drain regions between the gate electrodes of adjacent memory cells. The source regions are provided with polysilicon layers that are in strip form and are connected between the gate electrodes to provide common source lines. The drain regions are connected through polysilicon fillings to metallic interconnects that are applied to the top face as bit lines. In the transverse direction with respect to the sequence of the source region, gate electrode, and drain region, the individual cells in a memory cell configuration are isolated from one another by narrow isolation trenches (STI, shallow trench isolation). A preferred production method is particularly suitable for integration in a production process by which the electronic drive components in the periphery of the memory are also produced together with the memory cell configuration.

In accordance with another feature of the invention, there are provided isolation trenches in the semiconductor body separating the memory cell in the semiconductor body from further memory cells disposed on both sides of the memory cell in a direction of the gate line.

In accordance with a further feature of the invention, the source region and the drain region each have two sides, a gate electrode is disposed on each of the two sides of the source region and the drain region, the source line is a conductively doped polysilicon layer shaped as a strip and fills a region between the gate electrodes above the source region, a further conductively doped polysilicon layer is shaped as a strip and fills a region between the gate electrodes above the drain region and contacts the metallic drain line, and electrically isolating parting layers are respectively disposed between the gate electrodes and the polysilicon layer and the further polysilicon layer.

In accordance with an added feature of the invention, only one gate electrode is disposed in the memory cell between the polysilicon layer above the source region and the further polysilicon layer above the drain region.

In accordance with an additional feature of the invention, the gate electrode and a further gate electrode, provided as a select-gate electrode, of another memory cell of the plurality of memory cells are disposed in series through a further source region and further drain region of the other memory cell, and the gate electrode and the further gate electrode are disposed between the polysilicon layer above the source region and the further polysilicon layer above the drain region.

In accordance with yet another feature of the invention, the source region and the drain region each have a given dopant concentration, and a lightly doped drain region has a dopant concentration less than the dopant concentration in the source region and in the drain region, the lightly doped drain region is connected to the source region and to the drain region in a direction toward a respectively adjacent gate electrode in another of the plurality of memory cells.

In accordance with yet a further feature of the invention, the memory layer is silicon nitride, and the first boundary layer and second boundary layer are silicon oxide. Alternatively, the memory layer is tantalum oxide or hafnium silicate, and the first boundary layer and second boundary layer are silicon oxide. The memory layer can include hafnium oxide, hafnium silicate, zirconium oxide, or zirconium silicate, and the first boundary layer and the second boundary layer are aluminum oxide or silicon oxide containing aluminum.

The actual memory layer is disposed between boundary layers in the memory layer structure and is embedded in material having a wider energy band gap such that the charge carriers that are respectively received in the memory layer through the source region and through the drain region remain localized there. One preferable material for the memory layer is a nitride; an oxide is particularly suitable for the surrounding material. In a memory cell using silicon in the material system, the memory cell in the example is silicon nitride with an energy band gap of about 5 eV, and the surrounding boundary layers are silicon oxide with an energy band gap of about 9 eV. The memory layer may be a different material with a smaller energy band gap than that of the boundary layers, in which case, the difference between the energy band gaps is intended to be as great as possible to achieve good electrical confinement of the charge carriers. Thus, for example, tantalum oxide, hafnium silicate, or intrinsically conductive (undoped) silicon may be used, in conjunction with silicon oxide, as the material for the memory layer. In preferred embodiments, the memory layer may also, specifically, contain hafnium oxide, hafnium silicate, zirconium oxide, or zirconium silicate, and the boundary layers may be aluminum oxide or silicon oxide containing aluminum. Silicon nitride has a relative dielectric constant of about 7.9. The use of an alternative material having a higher dielectric constant (for example approximately 15 . . . 18) allows the total thickness of the layer stack provided for storage to be reduced, and is, thus, advantageous.

In accordance with yet an added feature of the invention, the gate electrode is formed by a conductively doped polysilicon layer and a layer containing metal and/or a layer sequence containing metal applied to the conductively doped polysilicon layer.

In accordance with yet an additional feature of the invention, the layer containing metal is a metal silicide or a double layer made of a metal nitride and a pure metal layer. Particularly, the layer containing metal is tungsten silicide or a double layer made of tungsten nitride and tungsten.

In accordance with again another feature of the invention, the first boundary layer is an oxide layer and is between 2.5 nm to 8 nm thick, the second boundary layer is an oxide layer and is between 3 nm to 12 nm thick, and the memory layer is between 1 nm to 5 nm thick.

In accordance with again a further feature of the invention, the drain line is a layer sequence made of titanium, titanium nitride, and tungsten or tantalum, tantalum nitride, and copper, in a direction of increasing distance from the drain region.

With the objects of the invention in view, there is also provided a method for producing a memory cell configuration, including the steps of producing a number of strip-shaped isolation trenches running in a straight line in parallel at a distance from one another in a semiconductor body, the semiconductor body having a given doping, applying a layer sequence including a first boundary layer, a memory layer, a second boundary layer, the first boundary layer, the memory layer, and the second boundary layer each made of a material having a respective energy band gap, the memory layer having a relatively narrow energy band gap and the first and second boundary layers having a relatively wide energy band gap, a conductively doped polysilicon layer, at least one layer containing metal, and a nitride layer, structuring the layer sequence into strip elements at least as far as the memory layer, the strip elements running in a straight line in parallel at a distance from one another transversely with respect to the isolation trenches, applying a further nitride layer to substantially all of a top surface of the strip elements, implanting a dopant to form lightly doped drain regions between the strip elements, producing spacing elements on sides of the strip elements, implanting dopant to form source and drain regions in regions between the spacing elements, filling spaces between the strip elements with electrically insulating material, substantially removing the insulating material in regions intended for a connection of the source and drain regions using a mask, with the insulating material remaining between the respective drain regions above the isolation trenches, removing the further nitride layer in open regions between the spacing elements and removing the spacing elements, filling the regions from which the insulating material was removed with an electrically conductively doped polysilicon layer, producing a dielectric layer outside regions of the polysilicon layer disposed above the drain region, and applying metallic drain lines and structuring the drain lines into strips disposed transversely with respect to the strip elements to respectively electrically conductively connect each of the drain lines to respective drain regions following one another in a straight line and to the polysilicon layer.

In accordance with again an added mode of the invention, the substantially removing the insulating material step is performed by leaving insulating material between an even-numbered strip element and a subsequent odd-numbered strip element, with respect to a sequential numbering of the strip elements, to form insulated source/drain regions between a respective drive gate and a select gate.

In accordance with again an additional mode of the invention, the insulating material between two components of the strip elements and between which there are source regions intended for connection to the polysilicon layer is completely removed to form source lines each electrically conductively connected to respective source regions following one another in a straight line.

In accordance with still another mode of the invention, the at least one layer containing metal is a metal silicide or a double layer made of a metal nitride and a pure metal layer.

In accordance with still a further mode of the invention, the at least one layer containing metal is tungsten silicide or a double layer made of tungsten nitride and tungsten.

In accordance with still an added mode of the invention, the substantially removing the insulating material step is performed before the removing the further nitride layer step.

In accordance with a concomitant mode of the invention, the removing the further nitride layer step is performed before the substantially removing the insulating material step.

Other features that are considered as characteristic for the invention are set forth in the appended claims.

Although the invention is illustrated and described herein as embodied in a memory cell and production method, it is, nevertheless, not intended to be limited to the details shown because various modifications and structural changes may be made therein without departing from the spirit of the invention and within the scope and range of equivalents of the claims.

The construction and method of operation of the invention, however, together with additional objects and advantages thereof, will be best understood from the following description of specific embodiments when read in connection with the accompanying drawings.

DESCRIPTION OF THE PREFERRED EMBODIMENTS

For the sake of clarity, the individual components of the memory cell according to the invention will be explained in the following text with reference to the process steps of one preferred production method.

In all the figures of the drawing, sub-features and integral parts that correspond to one another bear the same reference symbol in each case.

Figure 1:
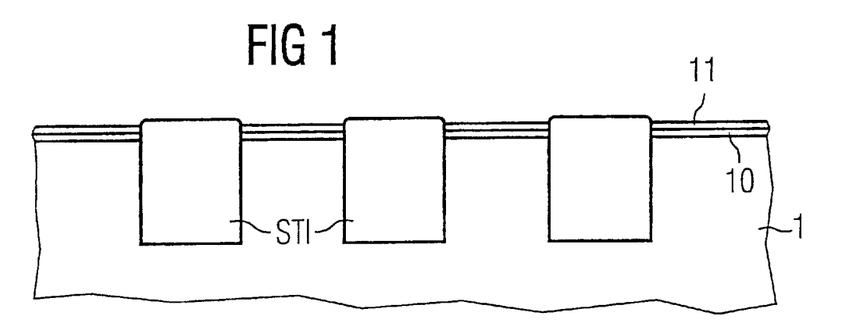
FIGS. 1 to 4 are fragmentary, cross-sectional views through intermediate products according to the invention and illustrating steps according to the production method of the invention.

Referring now to the figures of the drawings in detail and first, particularly to FIG. 1 thereof, there is shown a cross section through a semiconductor body 1, which may be a substrate composed of semiconductor material or a substrate provided with epitaxially grown layers. Semiconductor material that is p-doped is particularly suitable for such a purpose. The process steps to produce the memory cells are preferably carried out in parallel with the process steps that are used to produce the electronic components for the electronic circuit provided for driving the memory. If these are transistors in a circuit produced during a CMOS process, the process preferably starts, as normal, with the application of an initial oxide layer 10, which is intended as a pad oxide, to the top face of the semiconductor body 1, followed by application of an initial nitride layer 11, which is intended as a pad nitride, onto the oxide layer 10. The pad nitride is typically applied with a thickness of about 150 nm, as an etching stop and/or polishing stop. A photographic technique is then used, in conjunction with a mask that may be, for example, a conventionally used photoresist, to etch trenches that run in a straight line parallel at a distance from one another in the top face of the semiconductor body that is provided with the pad oxide and the pad nitride. Once the mask has been removed, the etched trenches are filled with an electrically insulating oxide. The isolation trenches STI (shallow trench isolation) illustrated in FIG. 1 are produced accordingly. The height of the initial nitride layer 11 and any shrinkage, which is unavoidable in the subsequent process steps, of the material introduced into the trenches are taken into account in that the filling of the trenches, as illustrated in FIG. 1, is carried out using a sufficient amount such that, in particular, the filling projects somewhat above the top face of the semiconductor body. As such, the top face can be planarized subsequently. The initial nitride layer 11 is removed by wet-chemical techniques. Marks that are required for further process steps are produced on the semiconductor body for orientation of the masks. These process steps are not, per se, essential to the invention and are carried out as normal in the course of the CMOS process.

The process steps that are carried out in any case also include the application of a sacrificial oxide, which can be applied separately once the initial oxide layer 10 has been removed, or for which the initial oxide layer 10 can itself be used. Both the wells that are used for the drive transistors and the wells that are used for the memory cells are then produced by implanting dopant for the relevant electrical conductivity in a specified concentration into the semiconductor body. When using a p-doped silicon substrate, the p-wells intended for the memory cells are produced by the introduction of boron. In a corresponding manner, n-wells are produced for the oppositely doped transistors in the CMOS circuits by introducing phosphorus or arsenic as the dopant. The sacrificial oxide is then removed, which can once again be accomplished by wet-chemical techniques, so that a semiconductor body is produced that is prepared with isolation trenches and wells and has a surface treated in a sufficiently protective manner.

Figure 2:
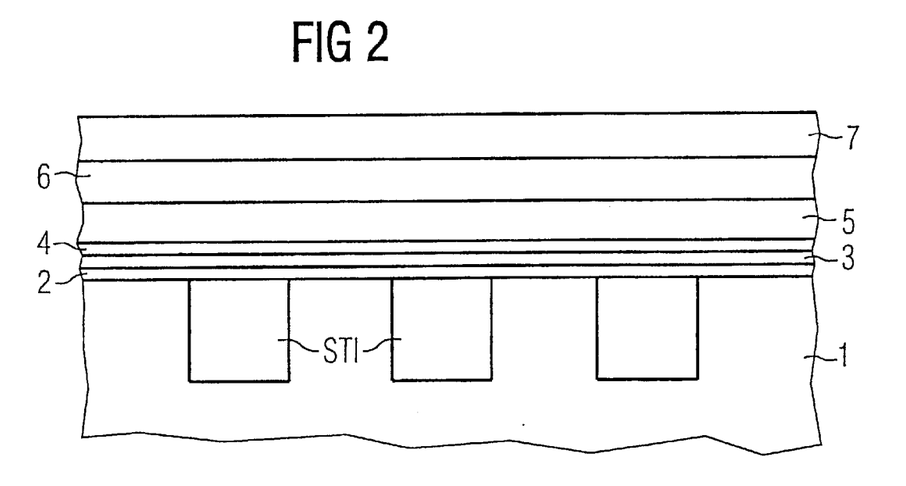

According to the cross section illustrated in FIG. 2, the layers of the memory layer structure can be applied to such a semiconductor body prepared as above, in particular with the following layers being applied one above the other in an ONO memory structure. First, a first oxide layer 2 is applied as the bottom oxide (lower boundary layer) and preferably has a thickness of, typically, 2.5 nm to 8 nm. A memory nitride layer 3 (memory layer) is applied that is intended as the actual memory medium and is preferably applied by low-pressure chemical vapor deposition (LPCVD) with a thickness of 1 nm to 5 nm. A second oxide layer 4 is applied as the top oxide (upper boundary layer) with a thickness of, typically, 3 nm to 9 nm, but also up to 12 nm. An electrically conductively doped polysilicon layer 5 is applied. At least one layer 6 is applied that contains metal and is intended as the supply lead to the gate electrode. A nitride layer 7 is applied as the top most layer, is structured in the subsequent steps, and is used as a hard mask.

In addition to the application of the layer sequence, which is intended for the memory cells, the layers required for the drive components are also applied. The application may be done, for example, after the application of the second oxide layer 4 and before the application of the polysilicon layer. In such a case, a thermal oxide is applied as the gate oxide for the CMOS transistors in the periphery. For the high-voltage transistors, the layer has a thickness of about 15 nm. If required, the method step can be repeated to produce additional, thinner oxide layers as a gate oxide for low-voltage transistors. The layer sequence, which is shown in the form of a cross section in FIG. 2, includes a layer 6 that contains metal and that, for example, may be a silicide, in particular, tungsten silicide. Instead of the compound, the layer 6 may also be a double layer composed of a metal nitride and a pure metal layer, for example, tungsten nitride and tungsten.

Figure 3:
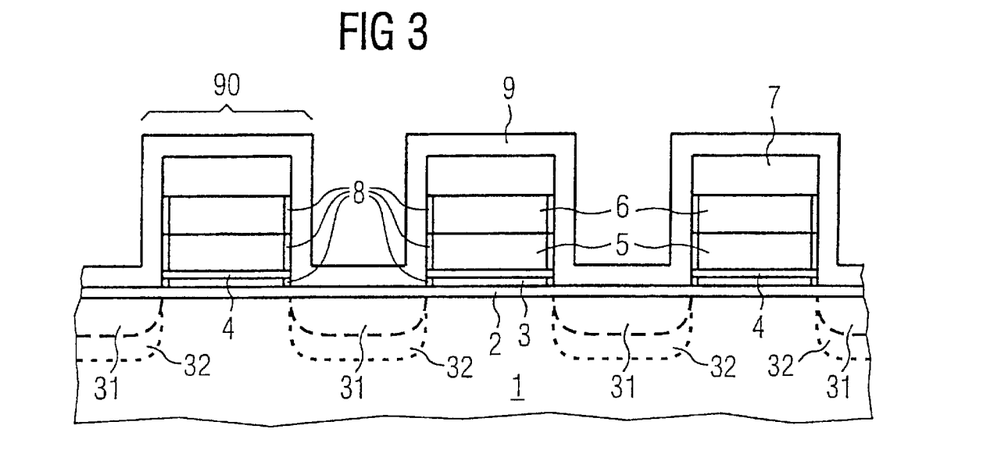

FIG. 3 illustrates a cross-section between two isolation trenches, and parallel to the isolation trenches. The layer sequence provided for the gate electrode is structured into components in strip form with a photographic technique. The structuring is preferably done by structuring the nitride layer 7 in the form of a grid with a photoresist mask that is structured from a number of parallel strips. The structured nitride layer 7 is then used as a hard mask to structure the other layers into webs that run parallel to one another in the manner illustrated in FIG. 3, from a respective strip-like component of the layer sequence. In the method step, etching is carried out down to but not including the memory nitride layer 3, with the memory nitride layer 3 preferably also being removed. The process results in the structuring shown in FIG. 3.

It is recommended that the side walls of the components of the layer sequence that are in strip form and are so obtained then be oxidized. These thin side wall oxide layers 8 are indicated in FIG. 3. During the oxidation process, the surface of the nitride layer 7 is also oxidized in a very thin layer (not illustrated in FIG. 3). Such oxidation is in any case insignificant, in the end, to the production process. The side wall oxide layer 8 has a typical thickness of about 6 nm.

Implantations are then incorporated, by which n-LDD regions and p-LDD regions are produced, including associated pocket implantation, which is present in the prior art, of the respectively opposite sign for the drive components in the periphery. In the case of a p-doped semiconductor body or a p-doped well produced for the memory cells, corresponding n-implantation 31 is then introduced to form the LDD regions provided for the memory cells, and p-implantation 32 is introduced as pocket implantation.

Figure 4:
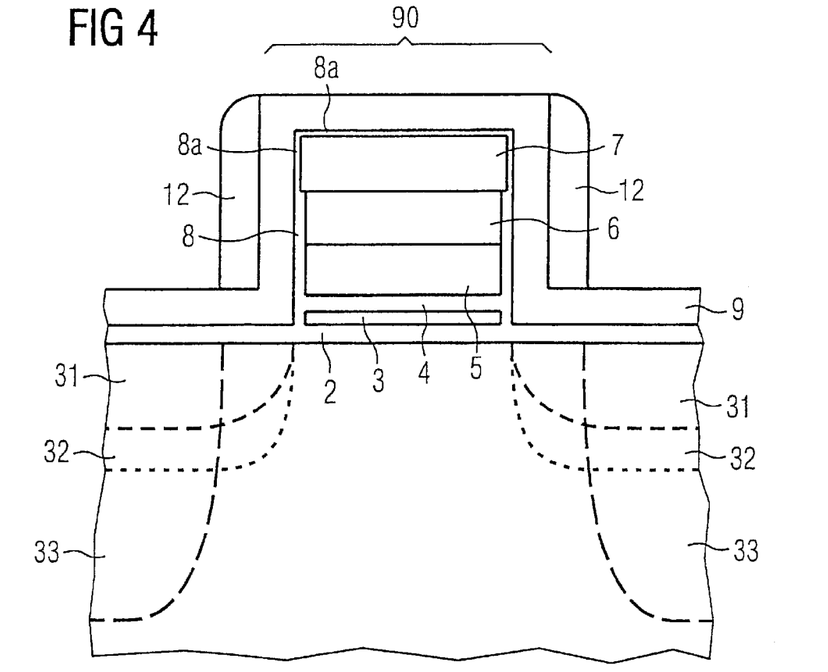
Figure 5:
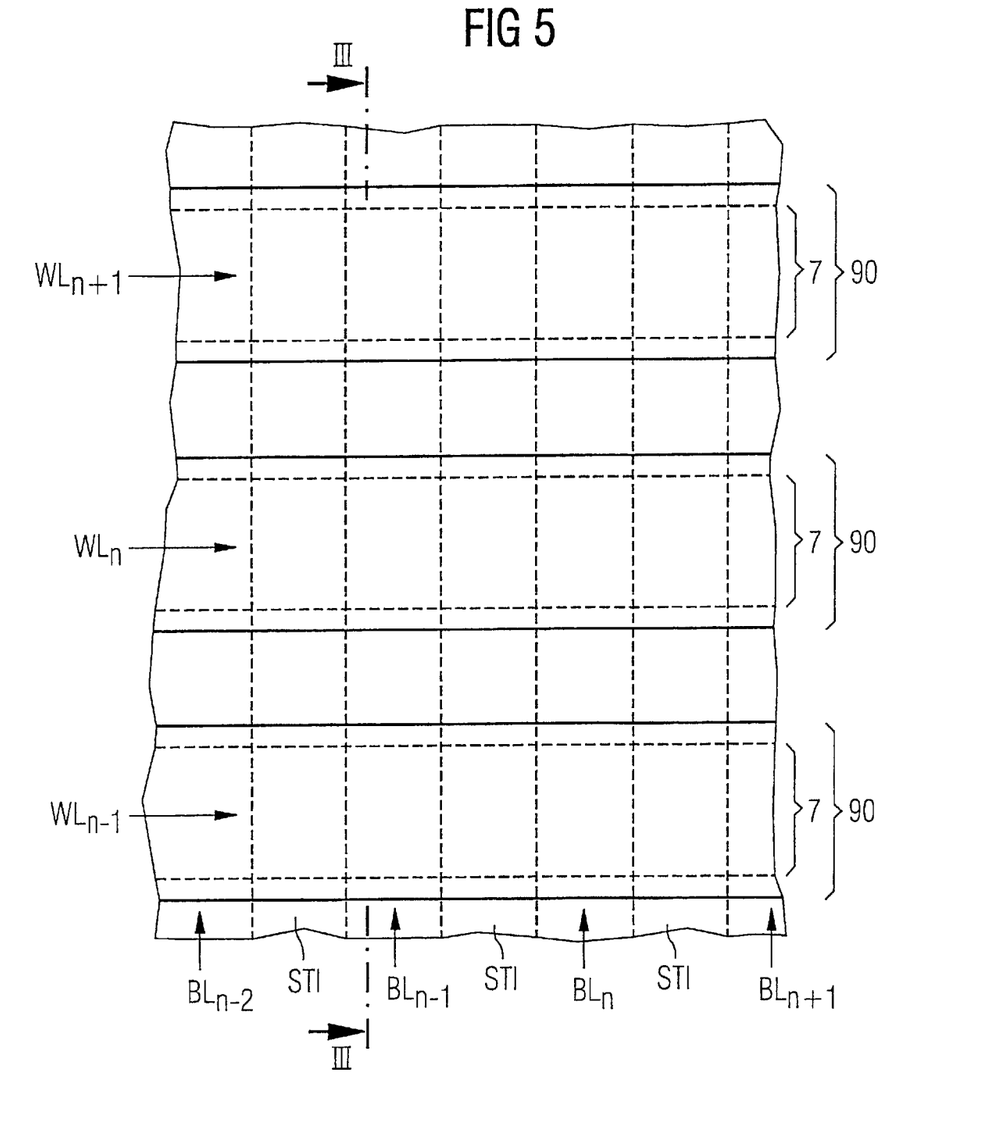
FIG. 5 is a fragmentary, plan view of the device and method according to the invention including the cross-section illustrated FIG. 3.

Deposition of a further nitride layer 9 over the entire surface with a thickness of, typically, about 10 nm follows. The upper edges of the layer sequence, which are in strip form and—in contrast to those in the idealized illustration in FIG. 3—can be rounded, are then each at a distance 90 from one another, which is also shown in FIGS. 4 and 5 for clarification. As a consequence of the side wall oxidation already carried out, the remaining components of the memory nitride layer 3 are separated from the further nitride layer 9 by narrow oxide strips on the side, that is to say, they are embedded all round in oxide.

FIG. 4 illustrates the region around a gate electrode. The reference symbol designations of the components correspond to the designations in FIG. 3. A very thin oxidation layer on the nitride layer 7 is shown as an oxide layer 8a. Here, it can clearly be seen that the memory nitride layer 3 is surrounded all the way round by oxide. Spacing elements 12 (spacers) are produced on both sides, on the vertical components of the nitride layer 9. The production is done in a conventional manner by initially applying a layer composed of the material that is provided for the spacing elements, normally an oxide, isotropically over the entire surface. Anisotropic back-etching is then used to remove the horizontally applied components of the layer, while only a small amount of material is removed in the lateral direction. The removal leaves the spacing elements 12 with approximately the cross-sectional shape shown.

The spacing elements shown, which have a width (layer thickness) of, typically, about 10 nm, are then used to produce implantation of dopant 33 for the source and drain regions. In the process, the spacing elements 12 shield the regions provided as LDD regions, so that such LDD regions with a lower dopant concentration remain at the side of the actual source and drain regions. Alternatively, the dopant can also be introduced by diffusion from the subsequently applied layer of polysilicon. In the method step, the corresponding implantations are also carried out for the components in the periphery.

FIG. 5 illustrates a plan view of the configuration of the isolation trenches STI and of the components of the layer sequence that are in strip form, before the production of the spacing elements 12. In other words, corresponding to the cross section that is illustrated in FIG. 3, the section line of which III—III is shown in FIG. 5. The regions between the isolation trenches are intended for the configuration of the bit lines $BL_n$. The word lines $WL_n$ are formed by the layers 6, which contain metal, of the components of the layer sequence, which are in strip form and connect the gate electrodes to one another. The surface, a plan view of which is shown in FIG. 5, is covered by the further nitride layer 9. Dashed lines, as concealed contours, show the side edges of the nitride layer 7 underneath it. The profiles of the isolation trenches are likewise shown as concealed contours, with dashed straight lines running at right angles thereto.

Figure 6:
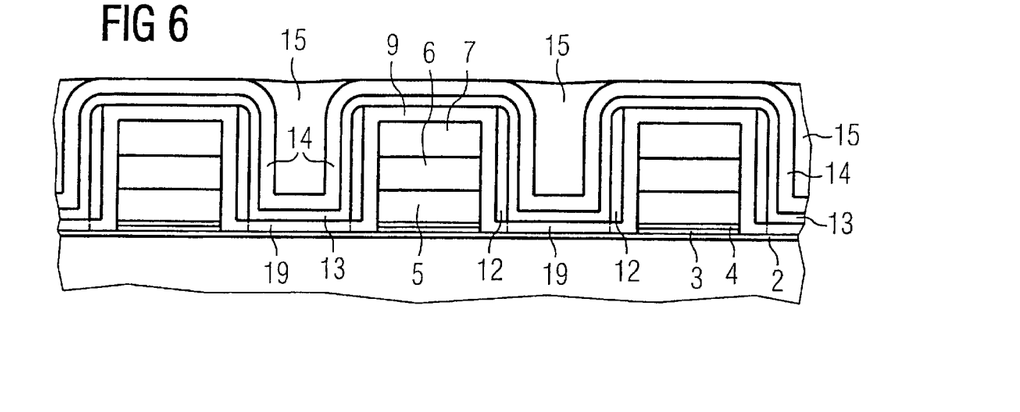
FIG. 6 is a fragmentary, cross-sectional view through the products of FIG. 1 illustrating another step in the production method according to the invention.

The regions between the components of the layer sequence that are in strip form are then filled with an electrically insulating material. The filling may be accomplished in various ways. First of all it is possible, once again, to deposit nitride on the further nitride layer 9. In the cross-section in FIG. 6, the supplementary nitride layer 13 illustrates the deposition. The actual electrically insulating material that is intended for the filling of the intermediate spaces is then introduced. The filling is, for example, silicon dioxide. It is sufficient for only the silicon dioxide layer 14, which is shown in FIG. 6, to be deposited initially, and for the rest of the volume, which still needs to be filled, to be filled with the boron-doped phosphosilicate glass (BPSG) filling 15. The BPSG is basically a special silicon oxide, which is doped with boron and phosphorus atoms, without influencing the electrical conductivity in the process. BPSG is widely used for the production of semiconductor components to flatten the surface, which has already be passivated but has not yet been planarized, of a semiconductor chip provided with circuit components, and, hence, to form a base for intermediate metal dielectrics and various interconnect levels that have to be applied.

In the production of the memory cell, it is also possible to dispense with the initial introduction of the silicon dioxide layer 14, if the entire filling is formed from BPSG. In the variant of the method described here, the spacing elements 12 are produced from a material with respect to which the fillings in the intermediate spaces can be removed selectively. One such material that is particularly suitable is oxynitride, which forms an etching stop during removal of silicon dioxide and BPSG. Consequently, in the regions in which the fillings in the spaces between the components of the layer sequence that are in strip form are subsequently removed, those components 19 of the further nitride layer 9 that are present in between and are shown in FIG. 6 can be removed using the spacing elements 12 that then still remain. If, as stated above, the spacing elements 12 are a conventional oxide, so that the oxide is removed together with the filling in the intermediate spaces, those components 19 of the further nitride layer 9 that are shown by dashed lines in FIG. 6 are etched away before the intermediate spaces are filled. Then, there is no need to deposit nitride once again (layer 13 in FIG. 6), and the silicon dioxide of the layer 14 and the BPSG filling 15 are introduced immediately. Both of the configuration variants each create the capability to remove the further nitride layer 9 on those regions of the top face of the semiconductor body 1 on which the more highly doped source and drain regions are formed, while the further nitride layer 9 still covers the LDD regions and the components of the layer sequence that are in strip form.

FIG. 7 once again illustrates a plan view of the surface, corresponding to the viewing direction in FIG. 5. The spaces between the components of the layer sequence that are in strip form are now completely filled with silicon dioxide and/or BPSG. In the example, it has been assumed that the fillings right at the top are formed by BPSG fillings 15, and between the BPSG fillings 15 the surface of the further nitride layer 9 still remains free. The position of the isolation trenches STI is also once again shown in FIG. 7 by the dashed straight lines as concealed contours. Similarly, the alignments intended for the bit lines $BL_n$ and the word lines $WL_n$ are illustrated by corresponding arrows. Photoresist masks 16 are applied to the top face, and each cover a region above a respective isolation trench. The illustration shown in idealized form in FIG. 7 does not, however, represent any restriction for the precise side boundaries of these photoresist masks 16. The regions covered by the photoresist masks 16 may thus, in particular, project at the sides beyond the projection of the isolation trenches at right angles to the layer planes. The essential feature for the configuration of the individual components of the photoresist mask 16 is only that the material of the fillings in the intermediate spaces in the regions intended for the bit lines above the semiconductor material can be removed. The material remaining under the photoresist masks is then used for electrical isolation between successive memory cells in the configuration. However, the regions of the intermediate spaces above the isolation trenches are not all covered; strips between two components of the layer sequence that are in strip form and run alongside one another are left free. These regions are used later to form common source lines.

Figure 7:
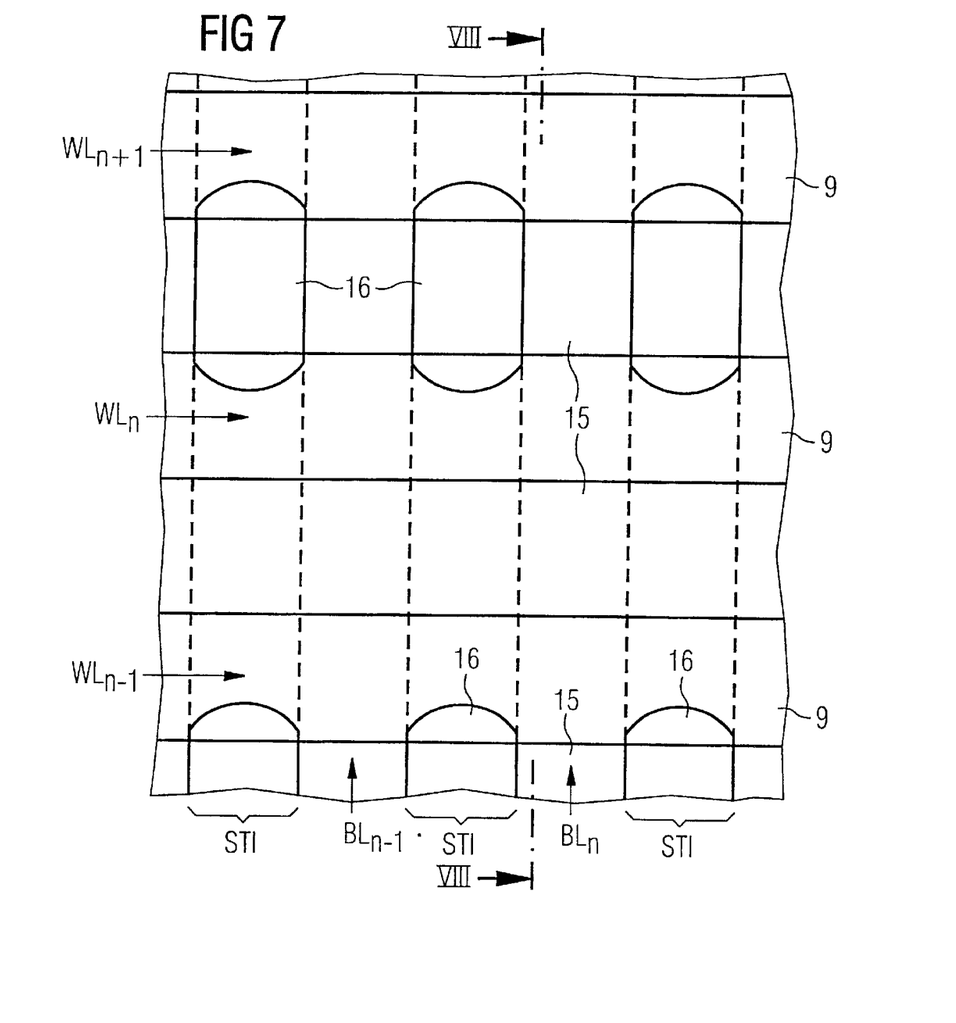
FIG. 7 is a fragmentary, plan view corresponding to the view of FIG. 5 illustrating another step in the production method according to the invention.

The detail in FIG. 7 illustrates six components of the photoresist mask 16; three complete components can be seen at the top, while the three lower components are each cut off at the bottom by the fragmentation lines that are shown. One such region of a BPSG filling 15, which is left free of the photoresist masks over its entire length, is located between the components of the photoresist mask 16 shown at the top and bottom in FIG. 7. The filling in the intermediate space can, thus, be removed over the entire length of the adjacent word lines $WL_{n-1}$ and $WL_n$.

Figure 8:
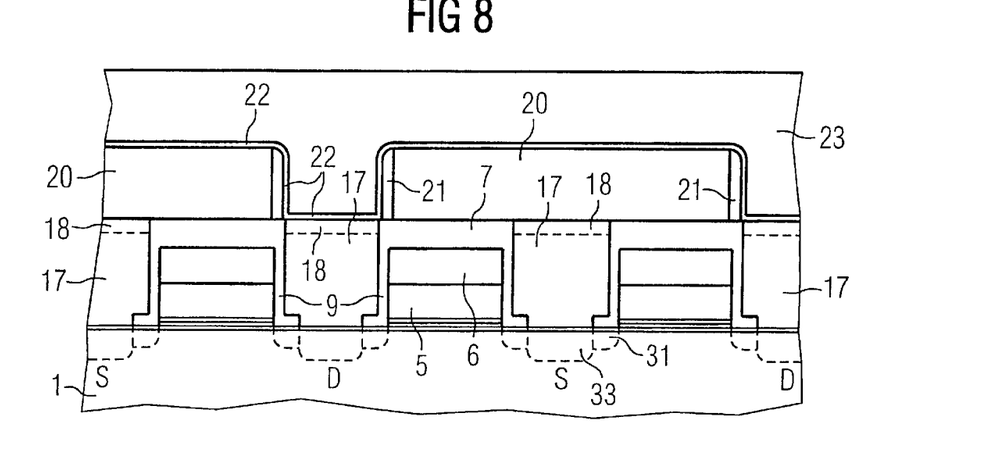
FIG. 8 is a fragmentary, cross-sectional view through a memory cell configuration according to the invention.

FIG. 8 is a cross-section, whose lower part shows the structure corresponding to the cross-section in FIG. 6. Because the nitride layer 7 and the further nitride layer 9 are produced from the same material, and preferably using an identical production process, no boundary contour is shown here between these layers. The further nitride layer 9 is in each case removed above a respective source region S and a drain region D. The fillings in the intermediate spaces, including the spacing elements 12, are likewise removed in those regions that are left free of the photoresist mask 16 in FIG. 7. These opened volumes are filled with an electrically conductively doped polysilicon layer 17, whose uppermost layer component may be formed by a metal silicide 18. The metal silicide (for example, cobalt silicide or titanium silicide) is used to reduce the supply lead resistance on the source side and, after planarization of the polysilicon layer 17, can be produced selectively on the components of the polysilicon layer 17 using a conventional salicide method. The metal silicide layer 18 may, however, also be omitted.

After the planarization of the top face, a dielectric layer 20 is applied and structured. Before the deposition of the dielectric layer, a further thin nitride layer can be applied over the entire surface. BPSG can once again be used here as the dielectric. Contact holes for the connection of the bit line are produced, with a further photographic technique, above the polysilicon layer, respectively over the drain regions D that are intended to make contact with the respective bit line. To make it easier to adjust the contact with the top face of the polysilicon layer 17 at these points, the spacing elements 21 that are shown can be produced at the side edges of the dielectric layer 20, which is structured with the contact holes. Then, the surface is preferably coated, in a conventional manner, with a thin metal nitride layer 22 as a liner nitride.

The material for the drain line 23, which is intended as a bit line, can then be deposited. The material is deposited into the contact holes, and is then electrically conductively connected to the respective components of the likewise conductive polysilicon layer 17 so that the respective drain regions D are electrically conductively connected to the drain line 23. The material used for the drain line 23 is preferably a layer sequence, with the layers deposited one on top of the other, of a metal, a metal nitride and a further metal, which is used for the interconnects in the wiring level. One possible layer sequence includes, for example, an initially deposited layer of titanium, followed by a layer of titanium nitride, and an upper layer of tungsten; one possible alternative is the layer sequence including tantalum, tantalum nitride, and copper right at the top.

The deposited layers are then structured into components that are strips, run parallel to one another and at a distance from one another, and are disposed in the direction shown for the bit lines $BL_n$ in FIG. 7. Intermediate metal dielectrics and various metallization planes for the electrical connection and wiring can then be applied in a conventional manner, in the same way as for the components in the periphery. The components of the polysilicon layer 17 form components that are strips and are each continuous above the source region S, as has already been described in conjunction with the form of the photoresist mask 16 shown in FIG. 7. These components of the polysilicon layer 17 can, thus, be used as a common source connection for all the adjacent memory cells (ground connection).

The individual memory cells are addressed through the drain line 23 (which is connected to the drain region) as the bit line and through the layer 6, which is in strip form (that contains metal and is connected to the gate electrode 5) as the word line. The storage process itself is carried out in a conventional manner from ONO structures by diffusing electrons out of the gate electrode and holding (trapping) them in the memory nitride layer 3. For such a purpose, it is sufficient to apply respectively the potentials that are suitable for storage in the cell, and that differ from the potentials that are applied for reading.

Figure 9:
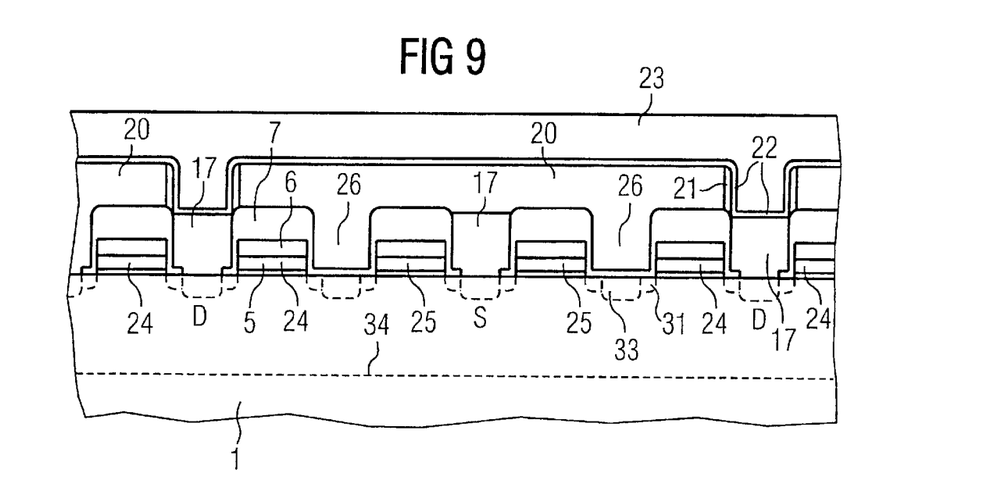
FIG. 9 is a fragmentary, cross-sectional view of an alternative embodiment of the memory cell of FIG. 8.

FIG. 9 illustrates another possible refinement of the memory cell configuration in which select gate electrodes are also provided, in addition to the gate electrodes. To produce the FIG. 9 structure, in the regions that are intended for the select transistors, and, preferably, in a method step in which the gate oxide is produced for the drive components in the periphery, the ONO layer sequence is removed, at least to such an extent that only the bottom oxide remains there. It is then oxidized to form the oxide layer that is intended to be the gate oxide for the select transistors. Alternatively, the bottom oxide can also be entirely removed; in such a case, a further oxide layer is produced separately as the gate oxide for the select transistors. Furthermore, the photoresist mask 16 shown in FIG. 7 is formed such that, in sequential numbering of the components of the layer sequence that are in strip form, the insulating material is left respectively between an even-numbered component and the odd-numbered component following it. The configuration leaves the intermediate spaces, which are annotated by 26 in FIG. 9, and are filled with silicon dioxide and/or BPSG. In principle, it is also possible to remove these fillings, and to fill the resultant openings with the same material as the dielectric layer 20. The stated use of a suitably structured photoresist mask 16 has the advantage, however, that the process is easier to manage. Thus, regions respectively provided with source/drain doping 33 are formed, in the illustrated manner, between the adjacent source and drain regions, and these regions do not have their own electrical supply lead. Rather, they are covered at the top by the insulating material in the regions 26. The drive gate electrodes 25, which are shown in FIG. 9, of the memory transistors thus have select gate electrodes 24 added to them, which are connected in series through the source/drain regions disposed in between, so that the select gate electrodes 24 can each be used as select gates for block-by-block addressing of memory cells. The configuration of drive gate electrodes and select gate electrodes can be interchanged from the configuration illustrated in FIG. 9, so that the configuration of memory transistors and select transistors is interchanged in comparison to the described embodiment. Thus, the select gate can be disposed both between the memory transistor and the bit line contact, and between the memory transistor and the common source line. FIG. 9 also shows the implantation 34, which is introduced by well implantation and has a higher dopant concentration than the basic doping of the semiconductor body 1.

The invention specifies a structure and a method for producing very small planar cross-point cells as SONOS cells, which can be connected up using a common-ground NOR architecture. Each cell is connected directly through a bit line contact to the metallic bit line. The advantages of such a configuration are: occupying only a very small planar area (cross-point cell); the capability for fast random read access; the capability for optimization of the S/D extensions of the memory transistors through LDD as in the case of CMOS (important for shrinkability); the capability for low-impedance source lines; compatibility of the memory cell construction with multi-bit storage; and little additional complexity in comparison to the base-logic process.

Particularly advantageous features of the memory cell according to the invention include: strip form isolation trenches in conjunction with the source lines, which are cut off transversely with respect thereto and are likewise in strip form; source lines that are self-adjusting with respect to the word lines; drain contacts that are self-adjusting with respect to the word lines; and a layer sequence that tolerates inadequate adjustment of the drain contacts in the direction of the word lines.

I claim:

1. A memory cell disposed on a semiconductor body having a top face, the memory cell comprising:
   a source region formed at the top face;
   a drain region;
   a gate line;
   a gate electrode disposed between said source region and said drain region at said top face, said gate electrode being part of said gate line, said gate line structured in strips and being a word line;
   a source line being a common source connection for a plurality of memory cells, said source line electrically contacting said source region between said gate electrode and another gate electrode of another of the plurality of memory cells;
   a drain line being a metallic interconnect electrically conductively connected to said drain region and disposed as a bit line running transversely with respect to said gate line and electrically isolated from said gate line;
   supply leads respectively connected to said source line, said drain line, and said gate line; and
   a memory layer structure having:
     a first boundary layer;
     a second boundary layer; and
     a memory layer disposed in between said first boundary layer and said second boundary layer;
     said memory layer serving as an actual storage medium;
     said memory layer, said first boundary layer, and said second boundary layer each made from a material having a repective energy band gap;
     said material of said memory layer having a relatively narrow energy band gap;
     said material of said first boundary layer and said second boundary layer having a relatively wide energy band gap; and
     said memory layer structure disposed between said semiconductor body and said gate electrode; and
   said source line running transversely with respect to said bit line.

2. The memory cell according to claim 1, including isolation trenches in the semiconductor body separating the memory cell in the semiconductor body from further memory cells disposed on both sides of the memory cell in a direction of said gate line.

3. The memory cell according to claim 1, wherein:
   said source region and said drain region each have two sides;
   a gate electrode is disposed on each of said two sides of said source region and said drain region;
   said source line is a conductively doped polysilicon layer shaped as a strip and fills a region between said gate electrodes above said source region;
   a further conductively doped polysilicon layer is shaped as a strip and fills a region between said gate electrodes above said drain region and contacts said metallic drain line; and
   electrically isolating parting layers are respectively disposed between said gate electrodes and said polysilicon layer and said further polysilicon layer.

4. The memory cell according to claim 3, wherein only one gate electrode is disposed in the memory cell between said polysilicon layer above said source region and said further polysilicon layer above said drain region.

5. The memory cell according to claim 3, wherein said gate electrode and a further gate electrode, provided as a select-gate electrode, of another memory cell of the plurality of memory cells are disposed in series through a further source region and further drain region of the other memory cell; and said gate electrode and the further gate electrode are disposed between said polysilicon layer above said source region and said further polysilicon layer above said drain region.

6. The memory cell according to claim 1, wherein:

said source region and said drain region each have a given dopant concentration; and a lightly doped drain region has a dopant concentration less than said dopant concentration in said source region and in said drain region, said lightly doped drain region is connected to said source region and to said drain region in a direction toward a respectively adjacent gate electrode in another of the plurality of memory cells.

7. The memory cell according to claim 1, wherein:

said memory layer is silicon nitride; and said first boundary layer and second boundary layer are silicon oxide.

8. The memory cell according to claim 1, wherein:

said memory layer is one of tantalum oxide and hafnium silicate; and said first boundary layer and second boundary layer are silicon oxide.

9. The memory cell according to claim 1, wherein:

said memory layer includes one of hafnium oxide, hafnium silicate, zirconium oxide, and zirconium silicate; and said first boundary layer and second boundary layer are one of aluminum oxide and silicon oxide containing aluminum.

10. The memory cell according to claim 1, wherein said gate electrode is formed by a conductively doped polysilicon layer and at least one of:

a layer containing metal; and a layer sequence containing metal, applied to said conductively doped polysilicon layer.

11. The memory cell according to claim 10, wherein said layer containing metal is one of:

a metal silicide; and a double layer made of a metal nitride and a pure metal layer.

12. The memory cell according to claim 11, wherein said layer containing metal is one of:

tungsten silicide; and a double layer made of tungsten nitride and tungsten.

13. The memory cell according to claim 1, wherein:

said first boundary layer is an oxide layer and is between 2.5 nm to 8 nm thick;

said second boundary layer is an oxide layer and is between 3 nm to 12 nm thick; and said memory layer is between 1 nm to 5 nm thick.

14. The memory cell according to claim 1, wherein said drain line is a layer sequence made of one of:

titanium, titanium nitride, and tungsten; and tantalum, tantalum nitride, and copper, in a direction of increasing distance from said drain region.

* * * * *